(12) United States Patent
Kojima et al.

(10) Patent No.: US 6,492,856 B1
(45) Date of Patent: Dec. 10, 2002

(54) EDGE TRIGGERED LATCH WITH SYMMETRICAL PATHS FROM CLOCK TO DATA OUTPUTS

(75) Inventors: Nobuo Kojima, Kusatsu (JP); Huajun Wen, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/145,847

(22) Filed: May 14, 2002

Related U.S. Application Data

(62) Division of application No. 09/886,001, filed on Jun. 21, 2001.

(51) Int. Cl.$^7$ ................................................. H03K 3/12
(52) U.S. Cl. .................... 327/218; 327/211; 327/219
(58) Field of Search ................................. 327/199–203, 327/208, 210–215, 218, 219

(56) References Cited

U.S. PATENT DOCUMENTS

| | | | | |
|---|---|---|---|---|
| 4,873,456 A | * | 10/1989 | Olisar et al. | ................. 327/202 |
| 5,936,449 A | * | 8/1999 | Huang | ......................... 327/211 |
| 6,163,189 A | * | 12/2000 | Ogawa | ......................... 327/201 |
| 6,222,404 B1 | * | 4/2001 | Mehta et al. | ................ 327/200 |
| 6,239,640 B1 | * | 5/2001 | Liao et al. | ................... 327/218 |

* cited by examiner

*Primary Examiner*—Terry D. Cunningham
*Assistant Examiner*—Long Nguyen
(74) *Attorney, Agent, or Firm*—Richard F. Frankeny; Winstead Sechrest & Minick P.C.; Casimer K. Salys

(57) ABSTRACT

A new D-type latch structure is disclosed which has an input data sampling circuit and a symmetrical cross coupled latching circuit. The clock is delayed a predetermined time through an inverter circuit. The clock and the delayed inverted clock are used to generate a clock window time during which time the data input state and the inverted data input state are asserted on the latch output and complementary. The latch outputs are cross-coupled to pull-up and pull-down circuitry in each output circuit stage. A common pull-down transistor may be used to further reduce devices and to improve path delays from clocks to the latch outputs. The clock window assertion of states of the data inputs to the changing latch output is enhanced by the cross-coupled feedback of the latch outputs to improve the differential transition timings of the latch outputs. The D-type latch has fewer transistors and better delay, and more precise transition skew over prior art designs.

14 Claims, 9 Drawing Sheets

EDGE TRIGGERED LATCH WITH SYMMETRICAL PATHS FROM CLOCK TO DATA OUTPUTS

This is a division of application Ser. No. 09/886,001 filed Jun. 21, 2001.

TECHNICAL FIELD

The present invention relates in general to logic circuits and in particular to D-type latches which have equal time delays from a clock to either an inverting output or a non-inverting output.

BACKGROUND INFORMATION

Latches or flip flops are key elements for many very large scale integrated (VLSI) circuit applications. The data or D-type latch is a particular latch type that is used for sampling data with a clock and holding a sampled value. The D-type latch may be designed to be either transparent or edge triggered. A transparent D-type latch is designed so that the output tracks the input when the clock is in one logic state and a latching function holds the output when the clock is in the other logic state. An edge triggered D-type latch allows the output to track the input only for a time window after the clock changes states. Edge triggered D-type latches may be either positive or negative edge triggered.

VLSI chips typically employ many latches and latch performance and power consumption is a continual concern. One latch parameter that is of particular interest is the time, from a clock edge, required to generate latched differential outputs and how well this time is balanced for each output. A perfectly balanced differential output latch would have the same time delay from a sampling clock edge to the generation of the inverting and non-inverting outputs. Well balanced differential output latches, and in particular D-type latches, are a critical component in many high performance logic systems. In digital communications systems where differential signaling is a common practice, the balance of latch differential outputs directly contributes to timing jitter and skew. Timing jitter and skew result in performance degradation and may be a limit to the total distance of digital data transmission. In order to minimize this problem, latches with well-balanced differential outputs are essential. There are various circuit configurations for latches in the art which are used for various logic applications. A D-type latch that gives one of the best characteristics in terms of power consumption and performance, and thus is widely used in high performance systems, is the so called hybrid-latch flip flop (HLFF) shown in FIG. 1. Despite its fast performance and relatively low power consumption, the HLFF latch 100 produces a delay difference from the clock 119 to differential outputs Q 122 and $Q_N$ 121. In order to obtain balanced differential outputs, two copies of this latch are used by some designers, a method which causes a near doubling of power consumption per latch.

Therefore, there is a need for a D-type latch with balanced differential outputs and a reduced power consumption over the prior art.

SUMMARY OF THE INVENTION

A D-type latch uses a clock and an inverted clock, delayed a predetermined time from the clock, to generate a clock window time (pulse). Two input logic circuits sample a data input and an inverted data input. In one embodiment the two input logic circuits share a common pull-down transistor which is turned ON by one of the clock signals. Two output logic circuits receive the sampled data outputs, the clock, and the inverted clock and generate a latch output and an inverted latch output. The first output logic circuit generates the latch output while receiving the sampled data output and the second output logic circuit generates the inverted latch output while receiving the inverted sampled data output. The latch output from the first output logic circuit is cross coupled as a feedback signal to pull-up and pull down circuits in the second output logic circuit. Likewise the inverted latch output from the second output logic circuit is cross coupled as a feedback signal to pull-up and pull-down circuits in the first output logic. The clock window time is generated in both the input logic circuits and the output logic circuits to assert latch output states determined by states on the data inputs. The cross coupled feedback of the latch outputs serves to both enforce the asserted states as well as hold the latch outputs after the clock window time. In another embodiment, the pull-down circuits in the input logic circuits do not share a common pull-down device. The D-type latch has equal circuit paths from the clock inputs to the latch outputs as well as low power, and minimum delay. The cross-coupled feedback of latch outputs improves delay, generates precise differential output transitions and lowers power consumption.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
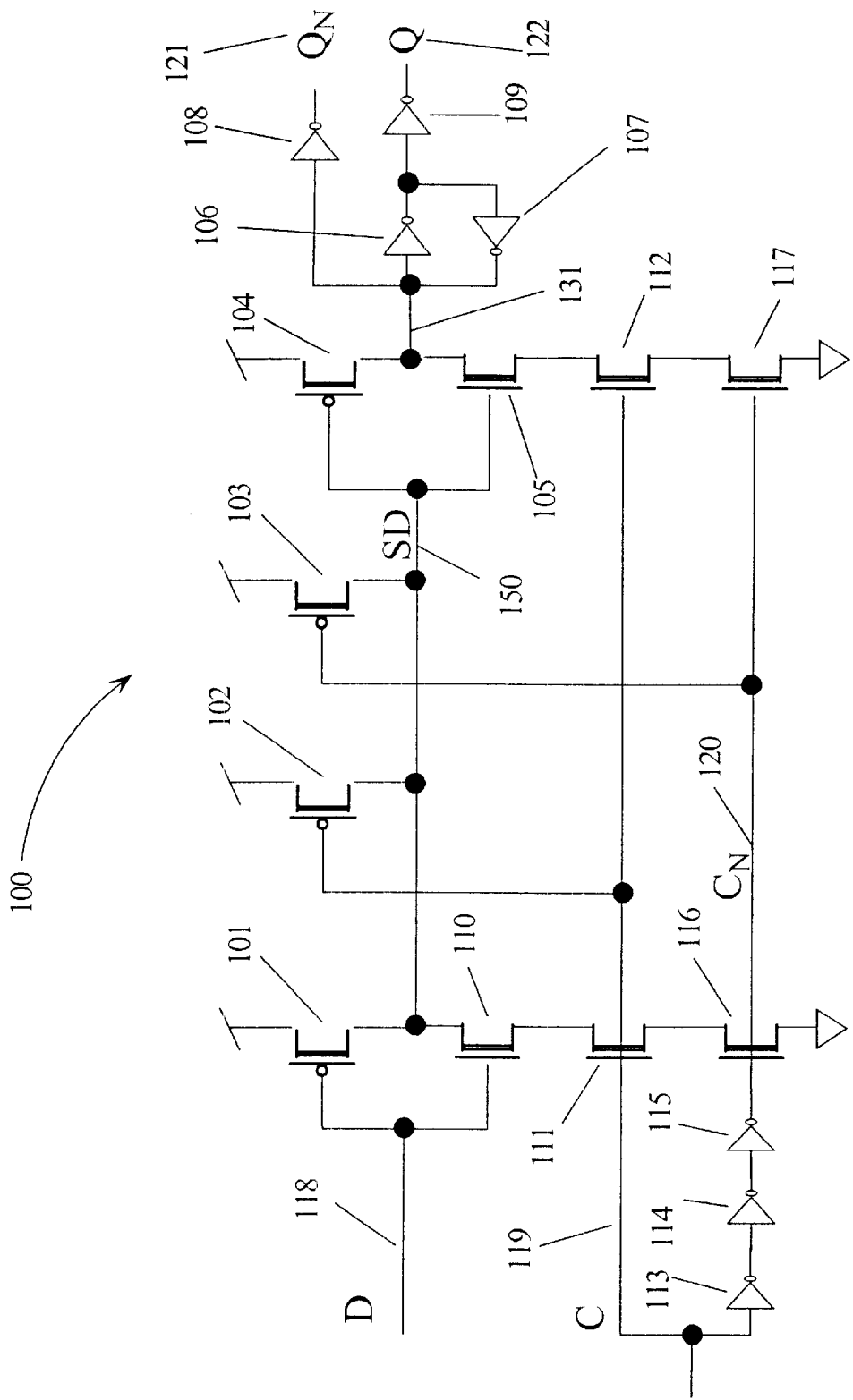
FIG. 1 is a circuit diagram of a prior art D-type latch.

In the following description, numerous specific details are set forth to provide a thorough understanding of the present invention. However, it will be obvious to those skilled in the art that the present invention maybe practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views. In the following detailed descriptions, a logic zero state may be referred to as a low or zero voltage level and a logic one state may be referred to as a high or a plus voltage level to simplify explanation of embodiments of the present invention.

FIG. 1 is a circuit diagram of a prior art D-type positive edge-triggered latch. Metal oxide semiconductor (MOS) transistors 101, 102, 103, 110, 111 and 116 form a three input NAND complementary MOS (CMOS) logic gate. Output 150 is coupled to the output latching circuit stage. Clock C 119 is inverted with inverters 113, 114 and 115 to form inverted clock $C_N$ 120. During steady state C 119 and $C_N$ 120 always have opposite logic states. However, when C 119 has been at a steady state logic zero and then transitions to a logic one, it takes a time determined by the delay through logic inverters 113, 114, and 115 for $C_N$ 120 to transition from its steady state logic zero to a logic one. In effect, this delay time creates a clock window (CW) time (a time when C 119 and $C_N$ 120 are both high), following the transition of C 119 to a logic one. During the CW time, transistors 111 and 116 are conducting (turned ON) and the sampled data output (SD) 150 will be pulled-down to ground (logic zero) or will remain at a logic one depending on the logic state of data input D 118. Correspondingly, the output 131 will be pulled-up by transistor 104 or pulled-down by the pull-down circuit consisting of transistors 105, 112 and 117. The cross-coupled inverters 106 and 107 form a latching circuit provided the circuitry driving output 131 has the ability to override the output drive of inverter 107 (e.g., when node 131 changes state). Transistors 104, 112 and 117 provide the function of forcing node 131 to a required logic state and insuring that node 131 is floating outside the CW time so that the output state of the cross-coupled inverters 106 and 107 remains latched.

If steady state is attained, C 119 and $C_N$ 120 are in opposite logic states and output 150 transitions to a logic one (high) turning ON transistor 105. With C 119 and $C_N$ 120 in opposite logic states, node 131 is floating both transistors 112 and 117 cannot both be ON and transistor 104 is OFF). Therefore, whatever logic state the latch circuit (inverters 106 and 107) has attained will remain latched and the latched logic state will be coupled to Q 122 and $Q_N$ 121 by inverters 109 and 108 respectively. For this reason, no logic state changes are possible on the outputs Q 122 and $Q_N$ 121 outside the CW time. If D 118 is a logic zero, then transistor 101 is ON and node 150 is pulled high to a logic one turning OFF transistor 104 and turning ON transistor 105. When C 119 transitions high, both transistors 112 and 117 turn ON during the CW time and transistors 105, 112, and 117 pull down node 131 and the latching action of inverters 106 and 107 sets Q 122 to a logic zero and correspondingly $Q_N$ 121 to a logic one. Likewise, if D 118 is a logic one, then transistor 101 is OFF and transistor 110 is ON so that node 150 is pulled low during the CW time. When 150 transitions low, transistor 104 turns ON and node 131 is pulled high and the latching action of inverters 106 and 107 sets Q 122 to a logic one and correspondingly $Q_N$ 121 to a logic zero. Prior art D-type latch 100 "samples" the data input D 118 during the CW time determined by the delay through inverters 113, 114 and 115. Since a D-type latch 100 is set to a logic state during the clock window time and no logic state changes are allowed outside the CW time, it is very important to define when the valid latch output states Q 122 and $Q_N$ 121 are attained. However, output Q 122 always has the extra time delay of the latch circuit formed by inverters 106 and 107. The time delay of the inverter 106 generates an extra delay in the Q 122 output which is not in the $Q_N$ 121 output. Also, inverters 108 and 109 do not provide cross-coupled and state changes on output Q 122 do not affect output $Q_N$ 121.

Figure 2:
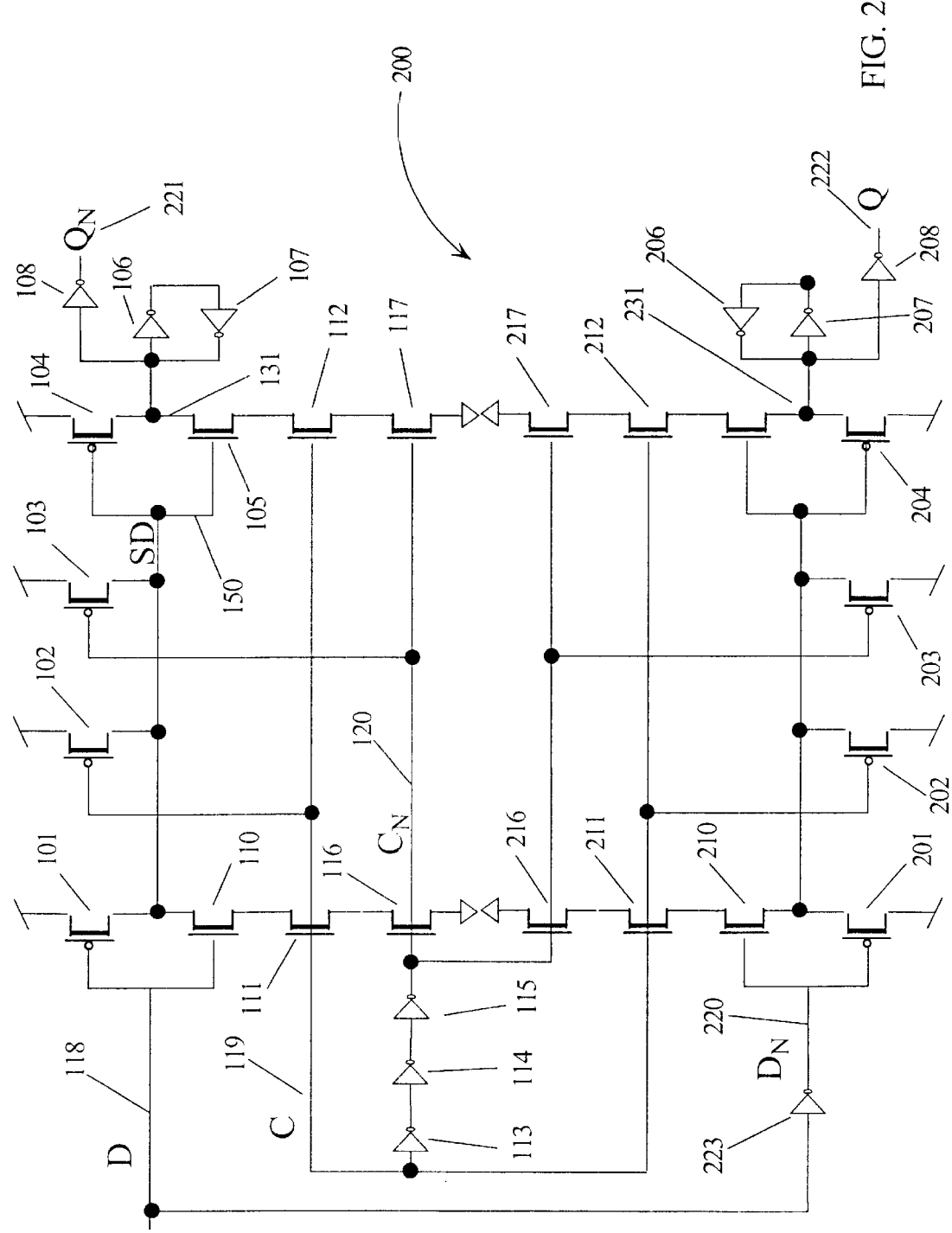
FIG. 2 is a circuit diagram using two D-type latches to create equal path delays from clocks to latch outputs.

FIG. 2 is a circuit diagram of a solution to the problem of unequal delays in the paths generating outputs Q 122 and $Q_N$ 121 discussed relative to the latch circuit in FIG. 1. Data input 118 is inverted with inverter 223 to form inverted data input $D_N$ 220. The first input circuit, comprising transistors 101–103, and 110, 111 and 116, is replicated to form a second input circuit with transistors 201–203 and 210, 211, and 216. Likewise, the first output circuit comprising transistors 104, 112, and 117 is replicated to form a second output circuit with transistors 204, 212, and 217. The first latching circuit consisting of inverters 106, 107 and 108 generates latch output $Q_N$ 221. This latching circuit is replicated to form a second latching circuit consisting of inverters 206, 207, and 208 to generate the complementary output Q 222. The clock inverting circuit that generates $C_N$ 120 from clock C 119 may not necessarily be replicated, rather, $C_N$ 120 may be coupled to both transistors 116 and 216 in the pull-down circuits. The prior art circuit 100 of FIG. 1 has been modified to circuit 200 to create equal delay paths from the clock inputs C 119 and $C_N$ 120 to the outputs Q 222 and $Q_N$ 221 at the expense of increasing the number of devices and the circuit power.

The basic circuit topology of the prior art latch circuit of FIG. 1 generates an edge triggered D-type latch by asserting a desired output state using a CW time generated by the forced coincidence of a clock and an inverted clock. While the outputs 131 and 231 in FIG. 2 have desired output states asserted during the CW time, these states may have to override a previous latched state of the output cross-coupled inverters (inverters 106 and 107 or inverters 206 and 207). In the prior designs, feedback from a latch state cannot aid in the assertion of logic states until a delay time through two inverters (e.g., inverters 106 and 107) and a response on one output (e.g., Q 222) does not affect a response on the other complementary output (e.g., $Q_N$ 221).

Figure 3:
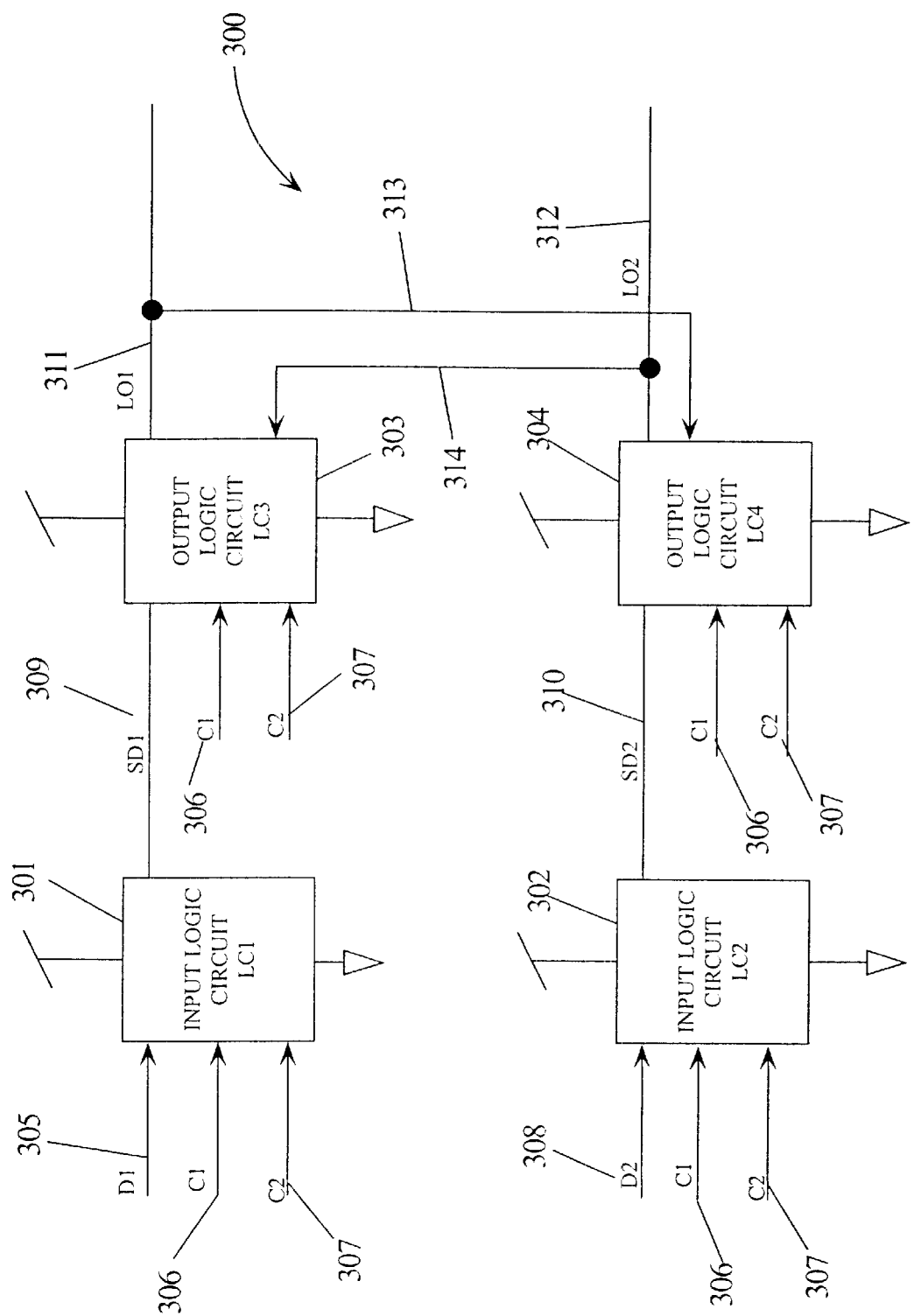
FIG. 3 is a block diagram of a D-type latch according to one embodiment of the present invention.

FIG. 3 is a block diagram of a D-type latch 300 according to embodiments of the present invention. The D-type latch 300 comprises four logic circuits; input logic circuits LC1 301 and LC2 302 and output logic circuits LC3 303 and LC4 304. LC1 301 and LC2 302 both receive clocks C1 306 and C2 307. LC 301 operates in response to a data input D1 305 and generates a sampled data output SD1 309 and LC 302 operates in response to a data input D2 308 and generates sampled data output SD2 310. The logic states of SD1 309 are asserted by C1 306 and C2 307 and generate latch output LO1 311, however, latch output LO2 312 is also fed back from LC4 304 to directly aid in switching and to hold the state on of LO1 311. Likewise, the logic states of SD2 310 are asserted by C1 306 and C2 307 and generate latch output LO2 312 and latch output LO1 311 is fed back from LC3 303 to directly aid in switching and to hold the state on LO2 312. The cross-coupled feedback of LO1 311 and LO2 312 creates a logic structure for D-type latch 300 that differs from the prior art in the use of cross-coupled feedback in combination with clock assertion of circuit states to improve latch circuit operation and lower power consumption. The prior art designs with cross-coupled metal oxide silicon (MOS) inverters (e.g., inverters 106 and 107) have a time period when both complementary MOS transistors in each inverter are ON and conducting.

Figure 5:
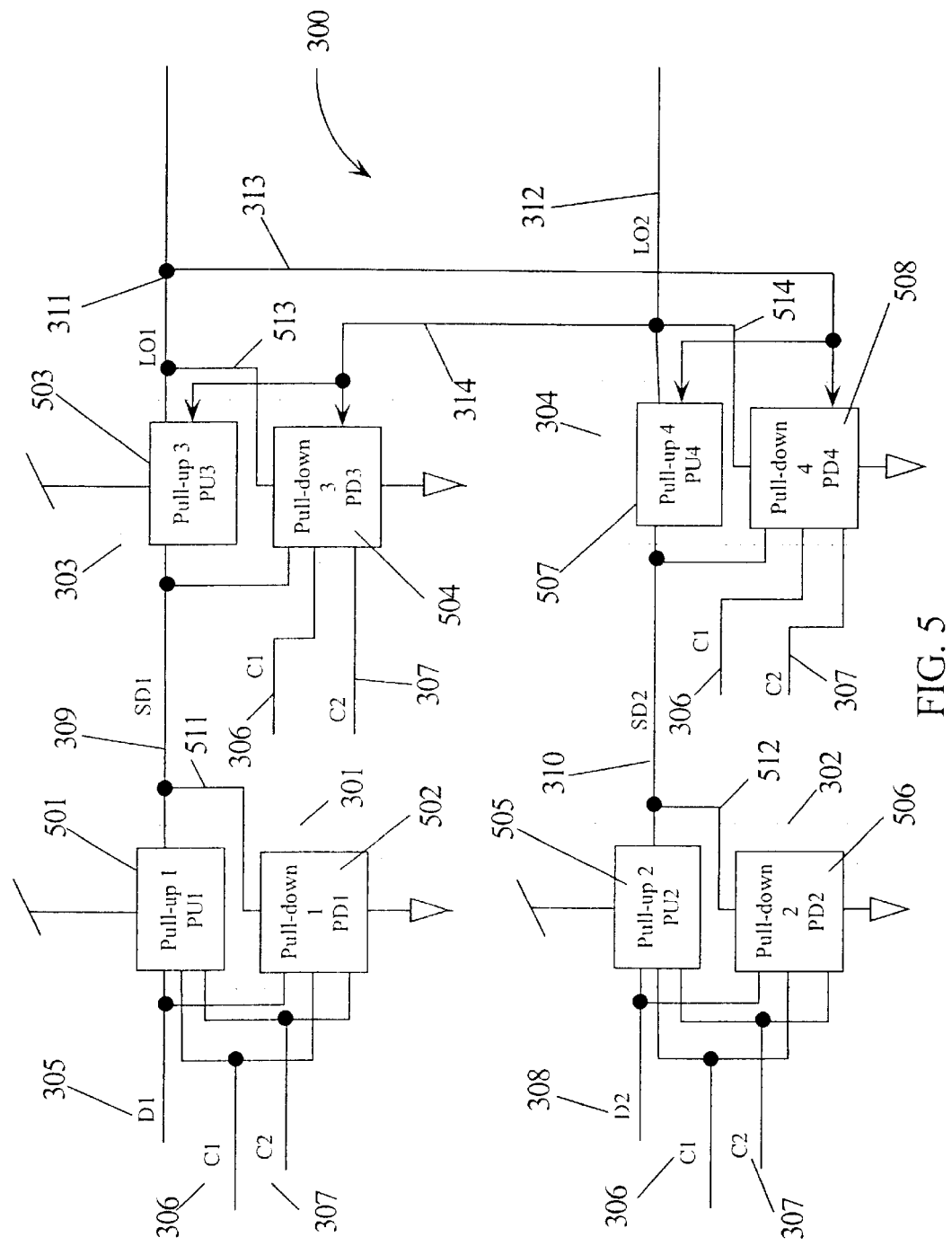
FIG. 5 is a block diagram of the D-type latch in FIG. 3 indicating pull-up and pull-down circuits.

FIG. 5 is a block diagram of D-type latch 300 where additional detail is shown to explain the operation of D-type latch 300 according to embodiments of the present invention. In embodiments of the present invention, LC1 301 is partitioned into pull-up circuit PU1 501 and pull-down circuit PD1 502 and LC2 302 is partitioned into pull-up circuits PU2 505 and pull-down circuit PD2 506. In D-type latch 300, LC1 301 and LC2 302 have identical circuit topology and the explanation of LC1 301 will suffice to explain LC2 302, the only difference is LC1 301 processes D1 305 to generate SD1 309 and LC2 302 independently processes D2 308 to generate SD2 310. When D1 305 is in one logic state and clocks C1 306 and C2 307 generate the CW time, PU1 501 operates to pull-up SD1 309 to a logic one state and when D1 305 is in the opposite logic state, then PD2 506 operates to pull-down SD1 309 to a logic zero via connection 511. PU2 505 and PD2 506 operate to pull-up and pull-down SD2 310 in the same fashion in response to D2 308 and the CW time generated by C1 306 and C2 307.

LC3 303 and LC4 304 are also partitioned into pull-up circuits PU3 503 and PU4 507 and pull-down circuits PD3 504 and PD4 508. While LC3 303 operates on SD1 309 to generate LO1 311 and LC4 304 operates on SD2 310 to generate LO2 312, LC3 303 and LC4 304 do not act independently, rather, they are each a function of the other's output (cross-coupled feedback of LO1 311 and LO2 312). Pull-down circuit PD3 504 is coupled to PU3 503 via connection 513 and PD4 508 is coupled to PD4 508 via connection 514. LO1 311 is coupled to both PU4 507 and PD4 508 and LO2 312 is coupled to both PU3 503 and PD3 504 so both pull-up and pull-down functions in LC3 303 and LC4 304 are directed by the cross-coupled feedbacks from LO1 311 and LO2 312. In one embodiment of the present invention both PD3 504 and PD4 508 receive clock inputs 306 and 307.

Figure 7:
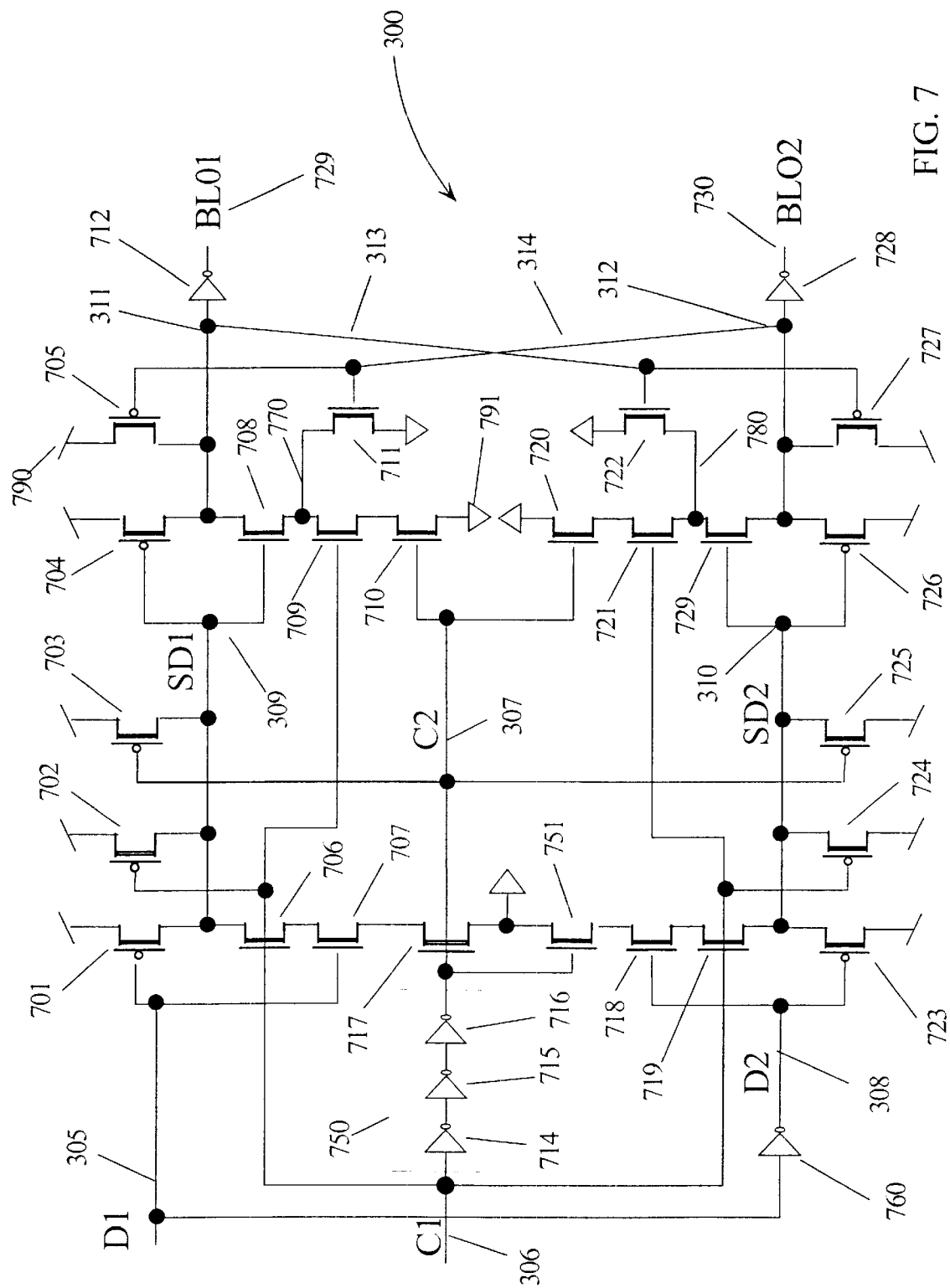
FIG. 7 is a circuit diagram of the D-type latch of FIG. 5 which has symmetrical path delays from a clock input to either an inverting or non-inverting output.

FIG. 7 is a circuit diagram of the D-type latch 300 according to embodiments of the present invention using complementary N channel metal oxide semiconductor (MOS) transistors (NFETs) and P-MOS transistors (PFETs). Data input D1 305 is inverted by inverter 760 to generate data input D2 308. Clock input C1 306 is inverted and delayed with inverter circuit 750 comprising a series logic connection of three inverters 714, 715, and 716 to generate C2 307. Other odd numbers of inverters may be used and still be withing the scope of the present invention. Inverter circuit 750 delays C1 306 a predetermined time ($T_{MIN}$) in generating C2 307. When C1 306 has been at a logic zero state for a time greater than time $T_{MIN}$, then both C1 306 and C2 307 will be at a logic zero state. However, when C1 306 quickly transitions to a logic one, both C1 306 and C2 307 will be at a logic one for time $T_{MIN}$, creating the CW time. Pull-up circuit PU1 501 is formed with PFETs 701–703. PFET 701 receives D1 305, PFET 702 receives C1 306 and PFET 703 receives C2 307. If either D1 305, C1 306, or C2 307 is at a logic zero, then SD 309 will be pulled to a logic one state. This happens whenever D1 305 is a logic zero or at anytime outside of the CW time regardless of the logic state of D 305. In effect, outside the CW time, SD1 309 and SD2 310 are "pre-charged" to the logic one state. When C1 306 quickly goes to a logic one, then either SD1 309 or SD2 310 will remain at a logic one (determined by the logic states of D1 305 and D2 308) and the other will be pulled down by its respective pull-down circuit PD1 502 or PD2 506. PD1 502 consists of NFETs 706, 707 and 717 and requires each NFET to be ON and conducting to pull-down SD1 309. PD2 506 consists of NFETs 718, 719 and 751. Since D1 305 and D2 308 are complementary signals, PD1 502 and PD2 506 do not both conduct during the CW time. During the CW time, whichever of the SD1 309 or SD2 310 that remains in a logic one state will act to pull-down its corresponding latch output LO1 311 or LO2 312. For example, if SD1 309 remains at a logic one during the CW time, then NFETs 708, 709 and 710 will turn ON and conduct. If the state of LO1 311 is changing from its previous latched state, then PFET 705 will be ON and LO1 311 will be pulled-up to a logic one. This means that LO2 312 is at a logic zero and will be changing to a logic one while LO1 311 is at a logic one and will be changing to a logic zero. If SD1 309 is to remain at its prior logic state of a logic one during the CW time, then SD2 310 must be changing from its logic one state to a logic zero state (D2 308 is at a logic one). This means that during the CW time NFETs 718, 719 and 751 are all ON and conducting, pulling SD2 310 down to a logic zero. When SD2 310 transitions to a logic zero, it serves to turn OFF NFET 729 and turn ON PFET 726 which starts the process of pulling LO2 312 to a logic one. As LO2 312 transitions to a logic one, the cross-coupled feedback of LO2 312 starts turning PFET 705 OFF removing the pull-up to LO1 311 and aiding in the transition of LO1 311. Likewise, as LO1 311 transitions toward a logic zero, cross-coupled feedback of LO1 311 starts turning OFF NFET 722 and turning ON PFET 727 aiding in the pull-up of LO2 312. Since LO1 311 and LO2 312 aid each other in changing states, the transitions of LO1 311 and LO2 312 are closely coupled creating differential latch outputs with matched transition times. D-type latch 300 also does not have the series delay of cross-coupled inverters in the latching circuit which may result in shorter times from latching a state of the data input (D1 305) until the latched state is valid. This may also shortens the required guarantee on the CW time and thus increases the frequency at which the D-type latch 300 may operate.

Figure 4:
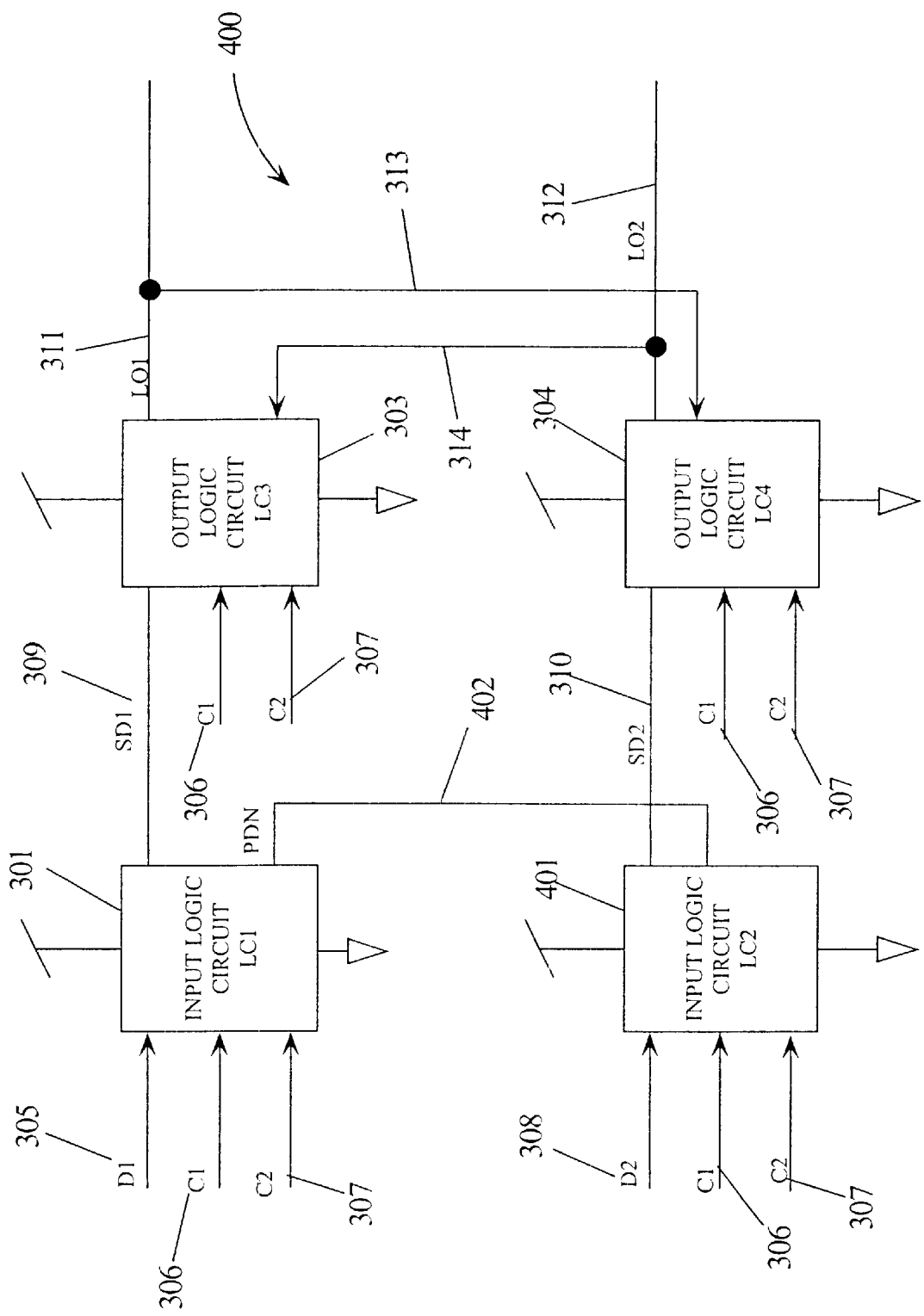
FIG. 4 is a block diagram of a D-type latch according to another embodiment of the present invention.

FIG 4 is a block diagram of a D-type latch 400 according to another embodiment of the present invention. The D-type 400 comprises four logic circuits; input logic circuits LC1 301 and LC2 401 and output logic circuits LC3 303 and LC4 304. LC1 301 and LC2 401 both receive clocks C1 306 and C2 307. LC 301 operates in response to a data input D1 305 and generates a sampled data output SD1 309 and LC 401 operates in response to a data input D2 308 and generates sampled data output SD2 310. D-type latch 400 takes advantage of the condition noted relative to D-type latch 300 where both D1 305 and D2 308 are differential signals. In D-type latch 400, a common pull-down node PDN 402 in LC1 301 is coupled to a node in LC2 401 in place of C2 307. The remaining operation of D-type latch 400 is similar to D-type latch 300.

The logic states of SD1 309 are asserted by C1 306 and C2 307 and generate latch output LO1 311, however, latch output LO2 312 is fed back from LC4 304 to directly aid in switching and to hold the state on LO1 311. Likewise logic states of SD2 310 are asserted by C1 306 and C2 307 and generate latch output LO2 312 and latch output LO1 311 is fed back from LC3 303 to directly aid in switching and to hold the state on LO2 312. While FIG. 4 does not detail how node PDN 402 and the cross-coupled feedback of LO1 311 and LO2 312 operate, the logic structure of the D-type latch 400 differs from the prior art by the use of cross-coupled feedback and the use of a common pull-down node in LC1 301 and LC2 401 in addition to CW time assertion of circuit states to improve circuit operation and lower power consumption.

Figure 6:
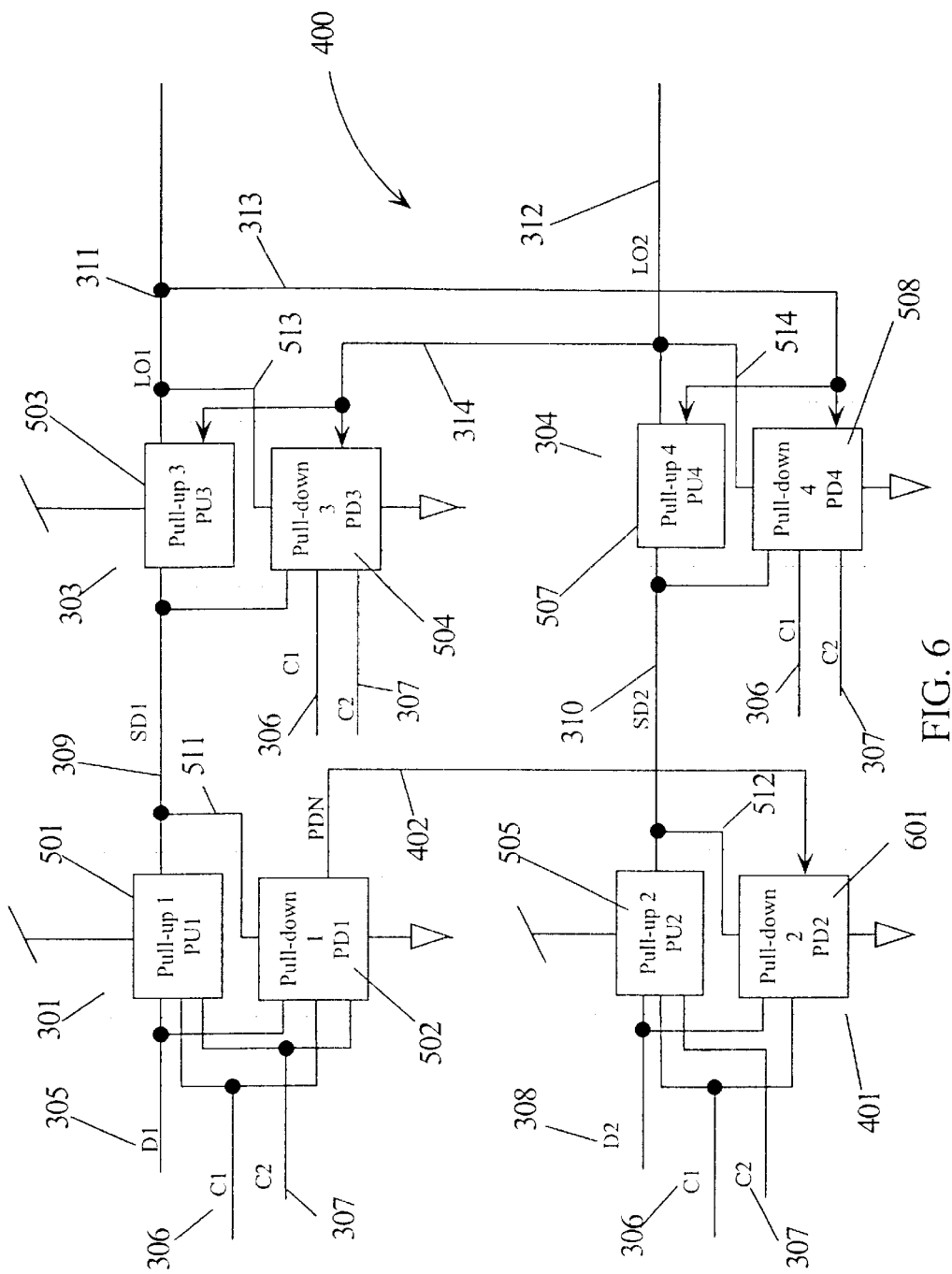
FIG. 6 is a block diagram of the D-type latch in FIG. 4 indicating pull-up and pull-down circuits.

FIG. 6 is a block diagram of D-type latch 400 where additional detail is shown to explain the operation of D-type latch 400 according to embodiments of the present invention. In embodiments of the present invention, LC1 301 is partitioned into pull-up circuit PU1 501 and pull-down circuit PD1 502 and LC2 401 is partitioned into pull-up circuits PU2 505 and pull-down circuit PD2 601. In D-type latch 400, LC1 301 and LC2 401 have a different circuit topology. LC1 301 processes D1 305 to generate SD1 310 and LC2 401 processes D2 308 to generate SD2 310 with the shared function of PDN 402. When D1 305 is in one logic state and clocks C1 306 and C2 307 generate the CW time, PU1 501 operates to pull-up SD1 309 to a logic one state and when D1 305 is in the opposite logic state, then PD1 502 operates to pull-down SD1 309 to a logic zero via connection 511. PU2 505 and PD2 601 operate to pull-up and pull-down SD2 310 in a similar fashion in response to D2 308 and the CW time generated by C1 306 and C2 307. The difference is that PD2 601 no longer receives C2 307, but rather common pull-down node PDN 402 is coupled to PD2 601. Since PD1 502 and PD2 601 are unlikely to be in a same logic state, a portion of the pull-down function of PD1 502 and PD2 601 are shared through PDN 402.

LC3 303 and LC4 304 are also partitioned into pull-up circuits PU3 503 and PU4 507 and pull-down circuits PD3 504 and PD4 508. While LC3 303 operates on SD1 309 to generate LO1 311 and LC4 304 operates on SD2 310 to generate LO2 312, LC3 303 and LC4 304 do not act independently, rather they are each a function of the other's output (cross-coupled feedback of LO1 311 and LO2 312 ). Pull-down circuit PD3 504 is coupled to PU3 503 via connection 513 and PD4 508 is coupled to PU4 507 via connection 514. LO1 311 is coupled to both PU4 507 and PD4 508 and LO2 312 is coupled to both PU3 503 and PD3 504 so both pull-up and pull-down functions in LC3 303 and LC4 304 are are directed by the cross-coupled feedbacks of LO1 311 and LO2 312. In one embodiment of the present invention both PD3 504 and PD4 508 receive clock inputs 306 and 307. In another embodiment of the present invention PD3 504 and PD4 508 do not receive clock inputs 306 and 307, rather the latch output LO1 311 is a function of SD1 309 and LO2 312 and latch output LO2 312 is a function of SD2 310 and LO1 311.

Figure 8:
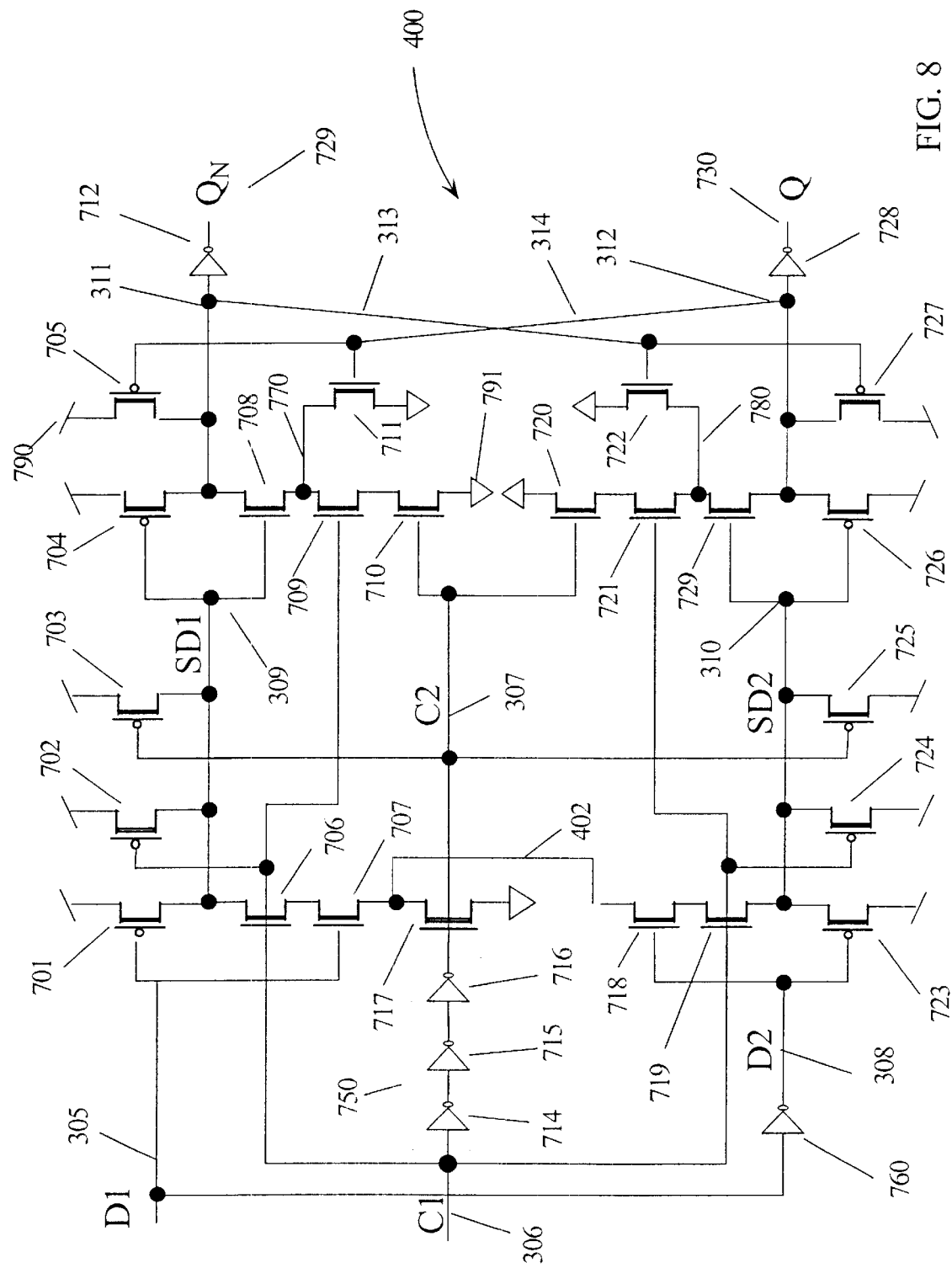
FIG. 8 is a circuit diagram of the D-type latch of FIG. 6 which has symmetrical path delays from a clock input to either an inverting or non-inverting output.

FIG. 8 is a circuit diagram of the D-type latch 400 according to embodiments of the present invention using NFETs and PFETs. Data input D1 305 is inverted by inverter 760 to generate data input D2 308. Clock input C1 306 is inverted and delayed with inverter circuit 750 comprising a series logic connection of three inverters 714, 715, and 716 to generate C2 307. Other odd numbers of inverters may be used and still be withing the scope of the present invention. Inverter circuit 750 delays C1 306 a predetermined time ($T_{MIN}$) in generating C 307. When C1 306 has been at a logic zero state for a time greater than $T_{MIN}$, then both C1 306 and C2 307 will be at a logic zero state. However, when C1 306 quickly transitions to a logic one, both C1 306 and C2 307 will be at a logic one for time $T_{MIN}$ creating the CW time. Pull-up circuit PU1 501 is formed with PFETs 701–703. PFET 701 receives D1 305, PFET 702 receives C1 306 and PFET 703 receives C2 307. If either D1 305, C1 306, or C2 307 is at a logic zero, then SD 309 will be pulled to a logic one state. This happens whenever D1 305 is a logic zero or at anytime outside of the CW time regardless of the logic state of D 305. In effect, outside the CW time, SD1 309 and SD2 310 are "pre-charged" to the logic one state. When C1 306 quickly goes to a logic one, then one of SD1 or SD2 will remain at a logic one (determined by logic states of D1 305 and D2 308) and the other will be pulled down by its respective pull-down circuit PD1 502 or PD2 602 with common pull-down node PDN 402. PD1 502 consists of NFETs 706, 707 and 717 and requires each to be conducting to pull-down SD1 309. PD2 602 consists of NFETs 718, 719 and common shared NFET 717 (shared via PDN 402). Since D1 305 and D2 308 are complementary signals, PD1 502 and PD2 506 do not both conduct during the CW time therefore allowing NFET 717 to be shared. Sharing NFET 717 also adds another degree of matching between the complementary sides of D-type latch 400 further improving the latch delay, transition times, and power consumption. During the CW time, whichever of the SD1 309 or SD2 310 that remains in a logic one state will act to pull-down its corresponding latch output LO1 311 or LO2 312. For example, if SD1 309 remains at a logic one during the CW time, then NFETs 708, 709 and 710 will turn ON and conduct. If the state of LO1 311 is changing from its previous latched state, then PFET 705 will be ON and LO1 311 will be pulled up to a logic one. This means that LO2 312 is at a logic zero and will be changing to a logic one while LO1 311 is at a logic one and will be changing to a logic zero. If SD1 309 is to remain at its prior logic state of a logic one during the CW time, then SD2 310 must be changing from its logic one state to a logic zero state (in response to D2 308 at a logic one state). This means that during the CW time NFETs 718, 719 and 751 are all ON and conducting pulling SD2 310 down to a logic zero. When SD2 310 transitions to a logic zero, it servers to turn OFF NFET 729 and to turn ON PFET 726 which starts the process of pulling LO2 312 to a logic one. As LO2 312 transitions to a logic one, the cross-coupled feedback of LO2 312 starts turning PFET 705 OFF removing the pull-up to LO1 311 and aiding in the transition of LO1 311. Likewise, as LO1 311 transitions toward a logic zero, the cross-coupled feedback of LO1 311 starts turning OFF NFET 722 aiding in the pull-up of LO2 312. Since LO1 311 and LO2 312 aid each other in changing states, the transitions of LO1 311 and LO2 312 are closely coupled creating differential latch outputs with matched transition times. D-type latch 400 also does not have the series delay of cross-coupled inverters in the latching circuit which may result in shorter times from latching a state of the data input (D1 305) until the latched state is valid. This may also shortens the required guarantee on the CW time and thus increases the frequency at which the D-type latch 400 may operate. The reduced path delays and the improved matching using a shared pull-down NFET 717 results in shorter times from latching a state of the data input (D1 305) and when the latched state is valid. Shorter and more consistent delays reduce the required minimum guaranteed CW time and thus increases the frequency at which the D-type latch 400 may operate. In another embodiment of the present invention where a reduction in device count is most important, NFETs 709, 710, 720 and 721 are eliminated. This may increase the assertion time of latch states on latch outputs LO1 311 and LO2 312 in exchange for lower power and fewer NFET devices. Eliminating NFETs 709, 710, 720 and 721 may also decrease the noise immunity of latch 400.

Figure 9:
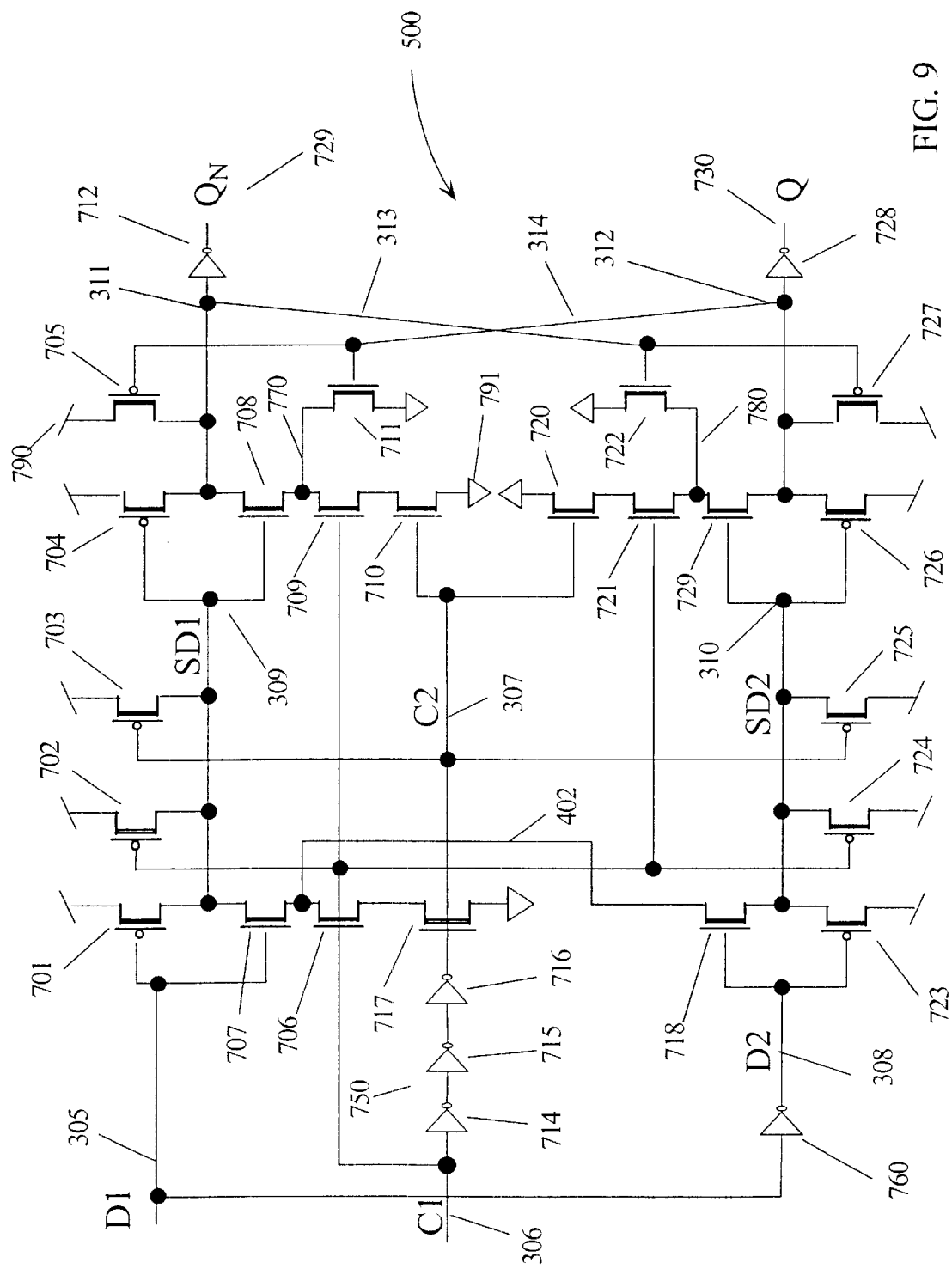
FIG. 9 is a circuit diagram of another embodiment of the present invention.

FIG. 9 is another embodiment of the present invention where latch 400 shown in FIG. 8 has been modified to form latch 500. NFET 719 has been eliminated and the drain of NFET 718 has been connected to the drain of PFET 723. NFETs 706 and 707 have been reversed in circuit position and the node formed with the connection of the source of NFET 707 and the drain of NFET 706 is coupled to the source of NFET 718 by the and connection 402. Since D1

305 and D2 308 are differential signals, NFETs 707 and 718 are never ON at the same time and the clock "tree" formed by the series connection of NFETs 706 and 717 may be shared in the two halves of latch 500. The output stage operation of latch 500 is like the output stage of latch 400.

The present invention and its advantages have been described in detail, it should be understood that various changes, substitutions and alterations can be made herein without departing from the spirit and scope of the invention as defined by the appended claims.

What is claimed is:

1. A latch comprising:
   a first logic circuit LC1 receiving a first data signal D1, a first clock signal C1 and a second clock signal C2 and generating a first sampled data output SD1 and a pull-down node output PDN, wherein said LC1 includes a first pull-up circuit PU1 electrically coupled to said D1, said C1, said C2 and said SD1, and a first pull-down circuit PD1, electrically coupled to said D1, said C1, said C2, and said SD1;
   a second logic circuit LC2 receiving a second data signal D2, said C1, said PDN, and said C2 and generating a second sampled data output SD2, wherein said LC2 includes a second pull-up circuit PU2 electrically coupled to said D2, said C1, said C2 and said SD2, and a second pull-down circuit PD2 electrically coupled to said D2, said C1, said PDN and said SD2;
   a third logic circuit LC3 receiving said SD1, said C1, said C2, and a second latch output LO2 and generating a first latch output LO1, wherein said LC3 includes a third pull-up circuit PU3 coupled to said SD1 and said LO2, and a third pull-down circuit PD3 coupled to said SD1, said C1, said C2, and said LO2; and
   a fourth logic circuit LC4 receiving said SD2, said C1, said C2, and said LO1 and generating said LO2, wherein said LC4 includes a fourth pull-up circuit PU4 coupled to said SD2 and said LO1, and a fourth pull-down circuit PD4 coupled to said SD2, said C1, said C2 and said LO1.

2. The latch of claim 1, wherein said C2 is generated by logic inverting said C1 in an inverting logic circuit and logic state transitions of said C2 are time delayed by said inverting logic circuit a predetermined time from logic state transitions of said C1.

3. The latch of claim 1, wherein said D2 is a logic inversion of said D1.

4. The latch of claim 1, wherein said LC1 comprises:
   first, second and third P channel metal oxide semiconductor transistors (PFETs) each having a source, drain and a gate electrode, said source electrodes of said first, second and third PFETs are electrically coupled forming a power supply node and said drain electrodes of said first, second and third PFETs are electrically coupled forming a first sampled data output node;
   first, second, and third N channel metal oxide semiconductor (NFET) transistors each having a source, drain and a gate electrode, wherein said source electrode of said first NFET is electrically coupled to said drain electrode of said second NFET, said source electrode of said second NFET is electrically coupled to said drain electrode of said third NFET creating said PDN, and said source electrode of said third NFET electrically coupled to a ground node and said drain electrode of said first NFET coupled to said first sampled data output node; wherein said LC1 further comprises:
   an electrical connection from said gate electrode of said first PFET to said gate electrode of said first NFET and to said D1;
   an electrical connection from said gate electrode of said second PFET to said gate electrode of said second NFET and to said C1; and
   an electrical connection from said gate electrode of said third PFET to said gate electrode of said third NFET and said C2, said first sampled data output node generating said SD1 in response to said D1, said C1, and said C2.

5. The latch of claim 1, wherein said LC2 comprises:
   first, second and third P channel metal oxide semiconductor transistors (PFETs) each having a source, drain and a gate electrode, said source electrodes of said first, second and third PFETs are electrically coupled forming a power supply node and said drain electrodes of said first, second and third PFETs are electrically coupled forming a second sampled data output node;
   first, and second N channel metal oxide semiconductor (NFET) transistors each having a source, drain and a gate electrode, wherein said source electrode of said first NFET is electrically coupled to said drain electrode of said second NFET, said source electrode of said second NFET is electrically coupled to said PDN and said drain electrode of said first NFET is electrically coupled to said second sampled data output node; wherein said LC2 further comprises:
   an electrical connection from said gate electrode of said first PFET to said gate electrode of said first NFET and to said D2;
   an electrical connection from said gate electrode of said second PFET to said gate electrode of said second NFET and to said C1; and
   an electrical connection from said gate electrode of said third PFET to said second sampled data output node generating said SD2 in response to said D2, said C1, and said C2.

6. The latch of claim 1, wherein said LC3 comprises:
   first and second PFETs each having a gate, source and drain electrode, wherein said source electrodes of said first and second PFETs are electrically coupled to a first voltage and said drain electrodes of said first and second PFETs are electrically coupled to form a first latch output node;
   a first, second, third and fourth NFET transistor each having a gate, source and drain electrode, wherein said drain electrode of said first NFET is electrically coupled to said first latch output node and said source electrode of said first NFET is electrically coupled to said drain electrode of said second NFET forming a first feedback node, said source electrode of said second NFET is electrically coupled to said drain electrode of said third NFET and said source electrode of said third NFET is electrically coupled to a second voltage, said drain electrode of said fourth NFET is electrically coupled to said first feedback node and said source electrode of said fourth NFET is electrically coupled to said second voltage; said LC3 further comprising:
   an electrical connection from said gate of said first PFET to said gate of said first NFET and to said SD1;
   an electrical connection from said gate of said second PFET to said gate of said fourth NFET and to said LO2;
   an electrical connection from said gate electrode of said second NFET to said C1; and
   an electrical connection from said gate electrode of said third NFET to said C2, wherein said first latch node generates said LO1 in response to said D1, said C1, said C2, and said LO2.

7. The latch of claim 1, wherein said LC4 comprises:

first and second PFETs each having a gate, source and drain electrode, wherein said source electrodes of said first and second PFETs are electrically coupled to a first voltage and said drain electrodes of said first and second PFETs are electrically coupled to form a first latch output node;

a first, second, third and fourth NFET transistor each having a gate, source and drain electrode, wherein said drain electrode of said first NFET is electrically coupled to said first latch output node and said source electrode of said first NFET is electrically coupled to said drain electrode of said second NFET forming a first feedback node, said source electrode of said second NFET is electrically coupled to said drain electrode of said third NFET and said source electrode of said third NFET is electrically coupled to a second voltage, said drain electrode of said fourth NFET is electrically coupled to said first feedback node and said source electrode of said fourth NFET is electrically coupled to said second voltage; said LC4 further comprising:

an electrical connection from said gate of said first PFET to said gate of said first NFET and to said SD2;

an electrical connection from said gate of said second PFET to said gate of said fourth NFET and to said LO1;

an electrical connection from said gate electrode of said second NFET to said C1; and an electrical connection from said gate electrode of said third NFET to said C2, wherein said first latch node generates said LO2 in response to said D2, said C1, said C2, and said LO1.

8. A latch comprising:

a first logic circuit LC1 receiving a first data signal D1, a first clock signal C1 and a second clock signal C2 and generating a first sampled data output SD1 and a pull-down node output PDN, wherein said LC1 includes a first pull-up circuit PU1 electrically coupled to said D1, said C1, said C2 and said SD1, and a first pull-down circuit PD1, electrically coupled to said D1, said C1, said C2, and said SD1;

a second logic circuit LC2 receiving a second data signal D2, said C1, said PDN, and said C2 and generating a second sampled data output SD2, wherein said LC2 includes a second pull-up circuit PU2 electrically coupled to said D2, said C1, said C2 and said SD2, and a second pull-down circuit PD2 electrically coupled to said D2, said C1, said PDN and said SD2;

a third logic circuit LC3 receiving said SD1 and a second latch output LO2 and generating a first latch output LO1, wherein said LC3 includes a third pull-up circuit PU3 coupled to said SD1 and said LO2, and a third pull-down circuit PD3 coupled to said SD1 and said LO2; and a fourth logic circuit LC4 receiving said SD2 and said LO1 and generating said LO2, wherein said LC4 includes a fourth pull-up circuit PU4 coupled to said SD2 and said LO1, and a fourth pull-down circuit PU4 coupled to said SD2 and said LO1.

9. The latch of claim 8, wherein said C2 is generated by logic inverting said C1 in an inverting logic circuit and logic state transitions of said C2 are time delayed by said inverting logic circuit a predetermined time from logic state transitions of said C1.

10. The latch of claim 8, wherein said D2 is a logic inversion of said D1.

11. The latch of claim 8, wherein said LC1 comprises:

first, second and third P channel metal oxide semiconductor transistors (PFETs) each having a source, drain and a gate electrode, said source electrodes of said first, second and third PFETs are electrically coupled forming a power supply node and said drain electrodes of said first, second and third PFETs are electrically coupled forming a first sampled data output node;

first, second, and third N channel metal oxide semiconductor (NFET) transistors each having a source, drain and a gate electrode, wherein said source electrode of said first NFET is electrically coupled to said drain electrode of said second NFET, said source electrode of said second NFET is electrically coupled to said drain electrode of said third NFET creating said PDN, and said source electrode of said third NFET electrically coupled to a ground node and said drain electrode of said first NFET coupled to said first sampled data output node; wherein said LC1 further comprises:

an electrical connection from said gate electrode of said first PFET to said gate electrode of said first NFET and to said D1;

an electrical connection from said gate electrode of said second PFET to said gate electrode of said second NFET and to said C1; and an electrical connection from said gate electrode of said third PFET to said gate electrode of said third NFET and said C2, said first sampled data output node generating said SD1 in response to said D1, said C1, and said C2.

12. The latch of claim 8, wherein said LC2 comprises:

first, second and third P channel metal oxide semiconductor transistors (PFETs) each having a source, drain and a gate electrode, said source electrodes of said first, second and third PFETs are electrically coupled forming a power supply node and said drain electrodes of said first, second and third PFETs are electrically coupled forming a second sampled data output node;

first, and second N channel metal oxide semiconductor (NFET) transistors each having a source, drain and a gate electrode, wherein said source electrode of said first NFET is electrically coupled to said drain electrode of said second NFET, said source electrode of said second NFET is electrically coupled to said PDN and said drain electrode of said first NFET is electrically coupled to said second sampled data output node; wherein said LC2 further comprises:

an electrical connection from said gate electrode of said first PFET to said gate electrode of said first NFET and to said D2;

an electrical connection from said gate electrode of said second PFET to said gate electrode of said second NFET and to said C1; and an electrical connection from said gate electrode of said third PFET to said second sampled data output node generating said SD2 in response to said D2, said C1, and said C2.

13. The latch of claim 8, wherein said LC3 comprises:

first and second PFETs each having a gate, source and drain electrode, wherein said source electrodes of said first and second PFETs are electrically coupled to a first voltage and said drain electrodes of said first and second PFETs are electrically coupled to form a first latch output node;

a first and second NFET transistor each having a gate, source and drain electrode, wherein said drain electrode of said first NFET is electrically coupled to said first latch output node and said source electrode of said first NFET is electrically coupled to said drain electrode of said second NFET said source electrode of said second NFET is electrically coupled to a second voltage, said LC3 further comprising:
- an electrical connection from said gate of said first PFET to said gate of said first NFET and to said SD1;
- an electrical connection from said gate of said second PFET to said gate of said second NFET and to said LO2, wherein said first latch node generates said LO1 in response to said D1 and said LO2.

14. The latch of claim 8, wherein said LC4 comprises:

first and second PFETs each having a gate, source and drain electrode, wherein said source electrodes of said first and second PFETs are electrically coupled to a first voltage and said drain electrodes of said first and second PFETs are electrically coupled to form a first latch output node;

a first and second NFET transistor each having a gate, source and drain electrode, wherein said drain electrode of said first NFET is electrically coupled to said first latch output node and said source electrode of said first NFET is electrically coupled to said drain electrode of said second NFET said source electrode of said second NFET is electrically coupled to a second voltage, said LC4 further comprising:
- an electrical connection from said gate of said first PFET to said gate of said first NFET and to said SD2;
- an electrical connection from said gate of said second PFET to said gate of said second NFET and to said LO1, wherein said first latch node generates said LO1 in response to said D2 and said LO1.

* * * * *